(12) United States Patent
Lee et al.

(10) Patent No.: US 11,886,652 B2
(45) Date of Patent: Jan. 30, 2024

(54) DISPLAY DEVICE AND METHOD OF MANUFACTURING THE SAME

(71) Applicant: Samsung Display Co., Ltd., Yongin-si (KR)

(72) Inventors: Wonse Lee, Seoul (KR); Donghyeon Jang, Hwaseong-si (KR); Yu-Jin Jeon, Seoul (KR); Il-Joo Kim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/863,900

(22) Filed: Jul. 13, 2022

(65) Prior Publication Data

US 2023/0168755 A1 Jun. 1, 2023

(30) Foreign Application Priority Data

Nov. 29, 2021 (KR) .................. 10-2021-0167081

(51) Int. Cl.
| | |
|---|---|
| *G06F 3/041* | (2006.01) |
| *G06F 3/044* | (2006.01) |
| *H10K 50/844* | (2023.01) |
| *H10K 50/86* | (2023.01) |
| *H10K 59/38* | (2023.01) |
| *H10K 59/40* | (2023.01) |
| *H10K 59/88* | (2023.01) |
| *H10K 59/122* | (2023.01) |

(Continued)

(52) U.S. Cl.
CPC .......... *G06F 3/0412* (2013.01); *G06F 3/0443* (2019.05); *H10K 50/844* (2023.02); *H10K 50/865* (2023.02); *H10K 59/122* (2023.02); *H10K 59/38* (2023.02); *H10K 59/40* (2023.02); *H10K 59/88* (2023.02); *H10K 71/00* (2023.02); *G06F 3/0446* (2019.05); *G06F 2203/04103* (2013.01); *G06F 2203/04112* (2013.01); *H10K 59/1201* (2023.02)

(58) Field of Classification Search
None
See application file for complete search history.

(56) References Cited

U.S. PATENT DOCUMENTS

2021/0226174 A1* 7/2021 Kim ................. H10K 59/40

FOREIGN PATENT DOCUMENTS

KR 102194923 B1 12/2020

\* cited by examiner

*Primary Examiner* — Brian M Butcher
(74) *Attorney, Agent, or Firm* — CANTOR COLBURN LLP

(57) ABSTRACT

A display device includes a substrate; a pixel electrode disposed on the substrate; a pixel defining layer disposed on the substrate and defining a pixel opening exposing a portion of the pixel electrode; a dummy pixel defining layer disposed on the pixel electrode in the pixel opening, and spaced apart from the pixel defining layer; a light emitting element disposed between the pixel electrode and the dummy pixel defining layer in the pixel opening; a common electrode covering the pixel defining layer, the dummy pixel defining layer, and the light emitting element; an encapsulation layer covering the common electrode; and a touch sensing layer including a light blocking pattern, wherein light blocking pattern is disposed on the encapsulation layer and overlaps at least a portion of the dummy pixel defining layer in a plan view.

20 Claims, 19 Drawing Sheets

(51) Int. Cl.
 *H10K 71/00* (2023.01)
 *H10K 59/12* (2023.01)

1

DISPLAY DEVICE AND METHOD OF MANUFACTURING THE SAME

This application claims priority to Korean Patent Application No. 10-2021-0167081, filed on Nov. 29, 2021, and all the benefits accruing therefrom under 35 U.S.C. § 119, the content of which in its entirety is herein incorporated by reference.

BACKGROUND

1. Field

Embodiments provide generally to a display device and a method of manufacturing the display device.

2. Description of the Related Art

A display device may include a plurality of pixels emitting light. The display device may display an image by combining light emitted from each of the plurality of pixels.

The display device may be frequently used in public places, and accordingly, there is growing need for the display device capable of displaying an image with a narrow viewing angle in order to protect personal information.

SUMMARY

Embodiment provides a display device in which a viewing angle is controlled.

Embodiment provides a method of manufacturing the display device.

A display device according to an embodiment includes: a substrate; a pixel electrode disposed on the substrate; a pixel defining layer disposed on the substrate and defining a pixel opening exposing a portion of the pixel electrode; a dummy pixel defining layer disposed on the pixel electrode in the pixel opening, and spaced apart from the pixel defining layer; a light emitting element disposed between the pixel defining layer and the dummy pixel defining layer in the pixel opening; a common electrode covering the pixel defining layer, the dummy pixel defining layer, and the light emitting element; an encapsulation layer covering the common electrode; and a touch sensing layer including a light blocking pattern, wherein the light blocking pattern is disposed on the encapsulation layer and overlaps at least a portion of the dummy pixel defining layer in a plan view.

In an embodiment, the touch sensing layer may further include: a first sensing pattern disposed on the encapsulation layer and overlapping at least a portion of the pixel defining layer in the plan view; a first insulating layer covering the first sensing pattern; and a second sensing pattern disposed on the first insulating layer, overlapping at least a portion of the pixel defining layer in the plan view, and electrically connected to the first sensing pattern.

In an embodiment, the light blocking pattern may be insulated from each of the first sensing pattern and the second sensing pattern.

In an embodiment, the light blocking pattern may include an upper light blocking pattern disposed in the same layer as the second sensing pattern.

In an embodiment, the light blocking pattern may include a lower light blocking pattern disposed in the same layer as the first sensing pattern.

In an embodiment, the upper light blocking pattern may overlap the lower light blocking pattern in the plan view.

In an embodiment, each of the first sensing pattern and the second sensing pattern may be disposed in a mesh form surrounding the light emitting element in the plan view, and may overlap at least a portion of the pixel defining layer in the plan view.

In an embodiment, an area of the light blocking pattern in the plan view may be more than or equal to about 80 percentages (%) and less than about 100% of an area of the dummy pixel defining layer in the plan view.

In an embodiment, the display device may further include: a first light blocking layer disposed on the touch sensing layer and overlapping at least a portion of the dummy pixel defining layer in the plan view, and a second light blocking layer disposed on the touch sensing layer and overlapping at least a portion of the pixel defining layer in the plan view.

In an embodiment, the second light blocking layer may surround the first blocking layer, and may be spaced apart from the first light blocking layer.

In an embodiment, the light blocking pattern may overlap at least a portion of the first light blocking layer in the plan view.

In an embodiment, the display device may further include a color filter layer disposed between the touch sensing layer and the first light blocking layer.

In an embodiment, an area of the first light blocking layer in the plan view may be equal to or larger than an area of the light blocking pattern in the plan view, and may be equal to or smaller than an area of the dummy pixel defining layer in the plan view.

A method of manufacturing a display device according to an embodiment includes: forming a pixel electrode on a substrate; forming a pixel defining layer and a dummy pixel defining layer on the substrate, where the pixel defining layer defines a pixel opening exposing at least a portion of the pixel electrode, and the dummy pixel defining layer is disposed on the pixel electrode in the pixel opening and is spaced apart from the pixel defining layer; forming a light emitting element disposed between the pixel defining layer and the dummy pixel defining layer in the pixel opening; forming a common electrode covering the pixel defining layer, the dummy pixel defining layer, and the light emitting element; forming an encapsulation layer covering the common electrode; and forming a touch sensing layer on the encapsulation layer, where the touch sensing layer includes a light blocking pattern overlapping at least a portion of the dummy pixel defining layer in a plan view.

In an embodiment, forming the touch sensing layer may include: applying a first conductive material on the encapsulation layer; forming a first sensing pattern overlapping at least a portion of the pixel defining layer in the plan view by patterning the first conductive material; forming a first insulating layer covering the first sensing pattern; applying a second conductive material on the first insulating layer; and forming a second sensing pattern and the light blocking pattern by patterning the second conductive material, where the second sensing pattern overlaps at least a portion of the pixel defining layer in the plan view.

In an embodiment, the light blocking pattern may be insulated from each of the first sensing pattern and the second sensing pattern.

In an embodiment, an area of the light blocking pattern in the plan view may be equal to more than about 80% and less than about 100% of an area of the dummy pixel defining layer in the plan view.

In an embodiment, the method may further include: applying a light blocking material on the touch sensing layer; and forming a first light blocking layer and a second light blocking layer by patterning the light blocking material, where the first light blocking layer overlaps at least a portion of the dummy pixel defining layer in the plan view, and the second light blocking layer overlaps at least a portion of the pixel defining layer in the plan view.

In an embodiment, the second light blocking layer may surround the first light blocking layer, and may be spaced apart from the first light blocking layer.

In an embodiment, an area of the first light blocking layer in the plan view may be equal to or greater than an area of the light blocking pattern in the plan view, and may be equal to or smaller than an area of the dummy pixel defining layer in a plan view in the plan view.

In the display device according to an embodiment, the dummy pixel defining layer and the light blocking pattern may block a portion of light emitted from the light emitting element, accordingly, the display device may display an image with relatively narrow viewing angle.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
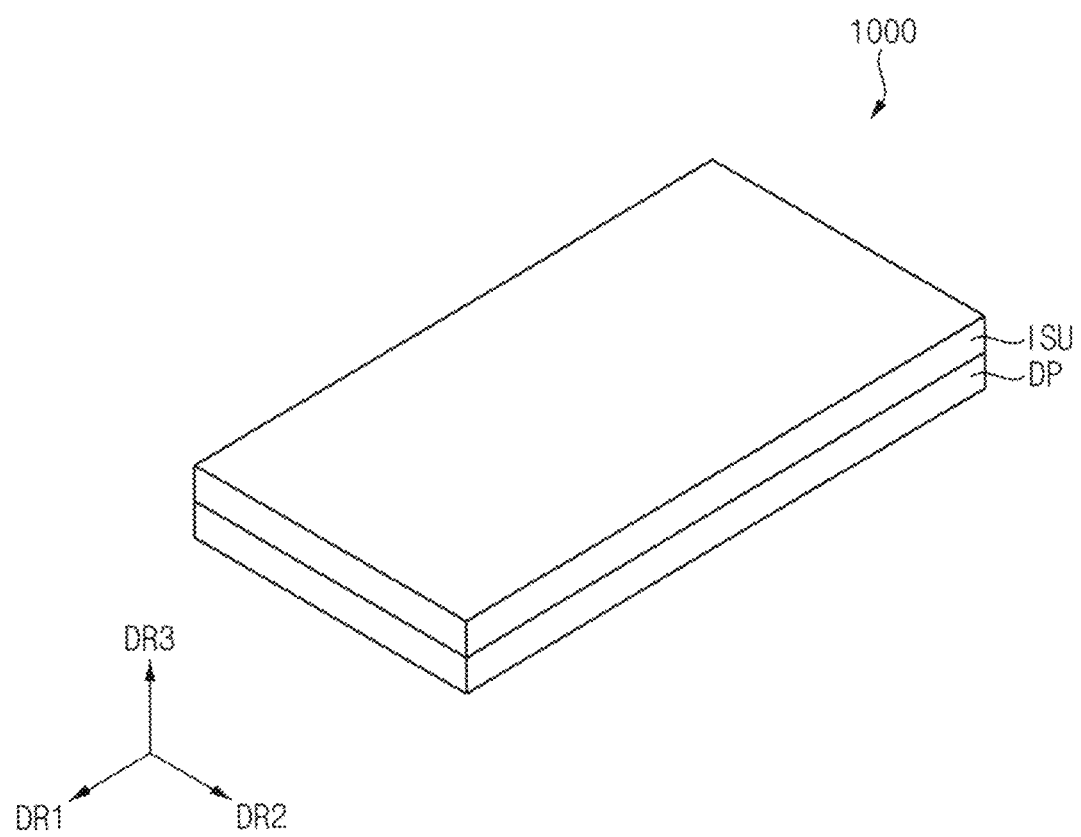
FIG. 1 is a perspective view illustrating a display device according to an embodiment.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below. Hereinafter, embodiments of the present disclosure will be explained in detail with reference to the accompanying drawings. The same reference numerals are used for the same components in the drawings, and redundant descriptions of the same components will be omitted.

FIG. 1 is a perspective view illustrating a display device according to an embodiment.

Referring to FIG. 1, a display device 1000 may include a display panel DP and a touch sensing layer ISU.

The display panel DP may display an image. The display panel DP may include a pixel emitting light and a driving part for driving the pixel.

The touch sensing layer ISU may be disposed on the display panel DP. The touch sensing layer ISU may detect touch of the user of the display device 1000. The touch sensing layer ISU may transmit the light emitted from the pixel.

Figure 2:
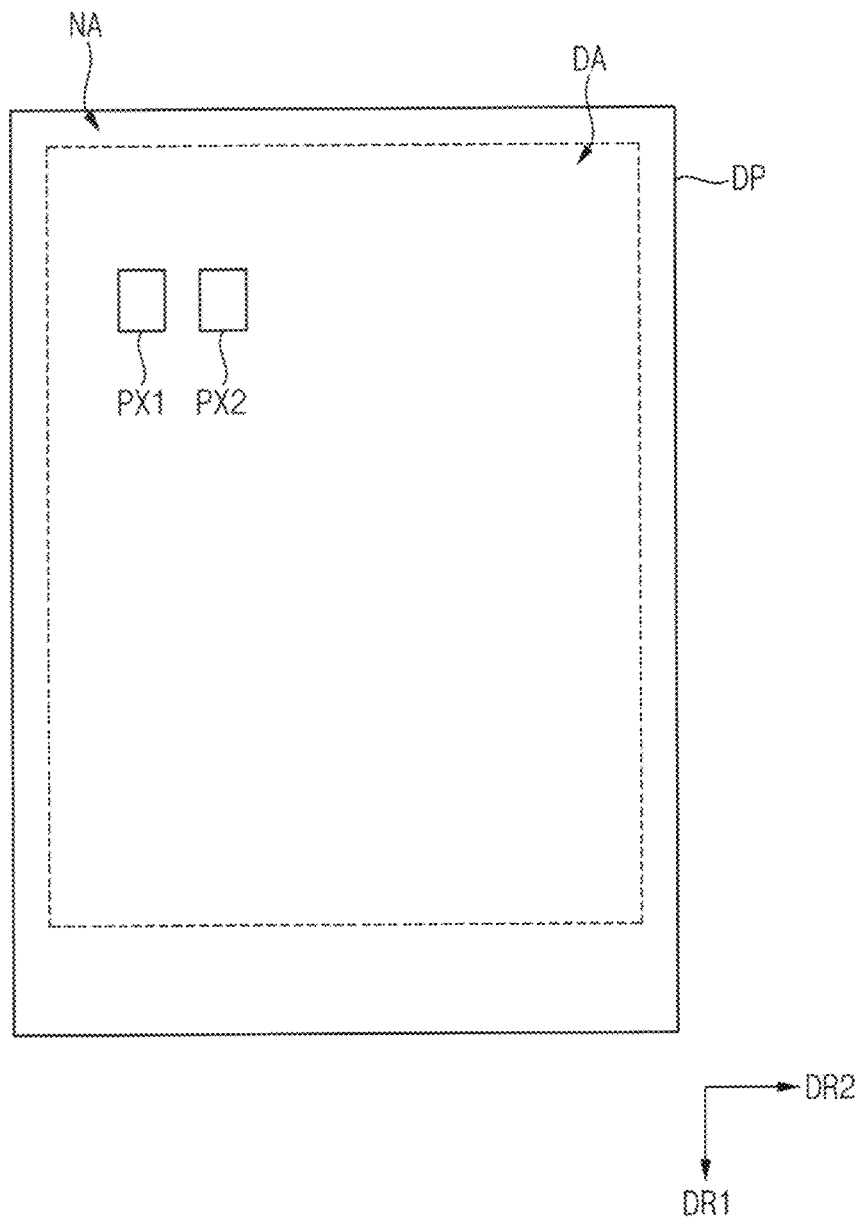
FIG. 2 is a plan view illustrating a display panel included in the display device of FIG. 1.

FIG. 2 is a plan view illustrating a display panel included in the display device of FIG. 1.

Referring to FIG. 2, the display panel DP may include a display area DA and a non-display area NA.

The pixel may be disposed in the display area DA. The pixel may include a first pixel PX1 and a second pixel PX2.

Light emitted from the first pixel PX1 may have a relatively narrow viewing angle, and light emitted from the second pixel PX2 may have a relatively wide viewing angle. Accordingly, when light is emitted from the first pixel PX1 and light is not emitted from the second pixel PX2, the display device 1000 may display an image with relatively narrow viewing angle.

The first pixel PX1 and the second pixel PX2 may be arranged in a matrix form. In an embodiment, for example, the first pixel PX1 and the second pixel PX2 may be alternately arranged along a first direction DR1, and at the same time, the first pixel PX1 and the second pixel PX2 may be alternately arranged along a second direction DR2 perpendicular to the first direction DR1.

The non-display area NA may be disposed adjacent to at least one side of the display area DA. The driving part may be disposed in the non-display area NA.

Figure 3:
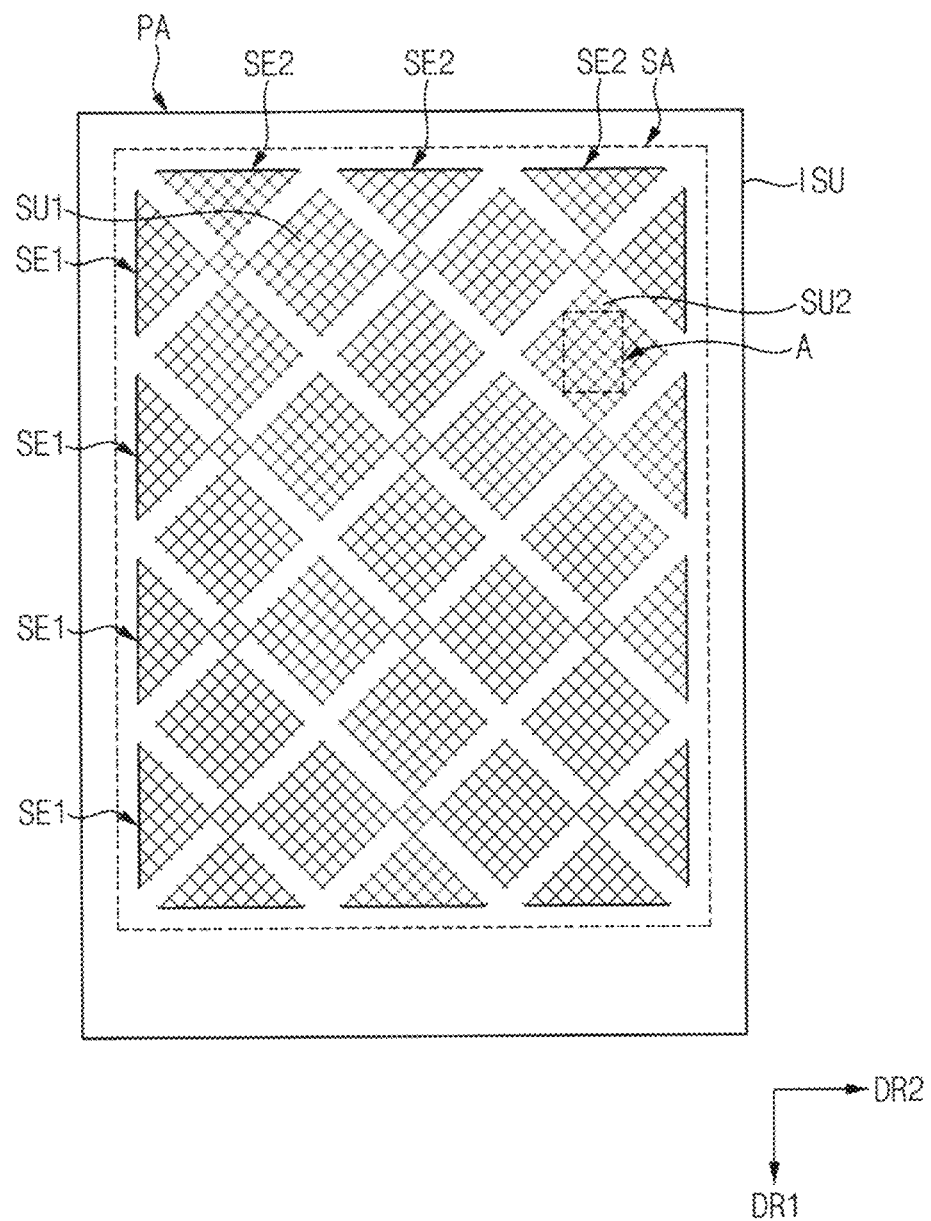
FIG. 3 is a plan view illustrating a touch sensing layer included in the display device of FIG. 1.
Figure 4A:
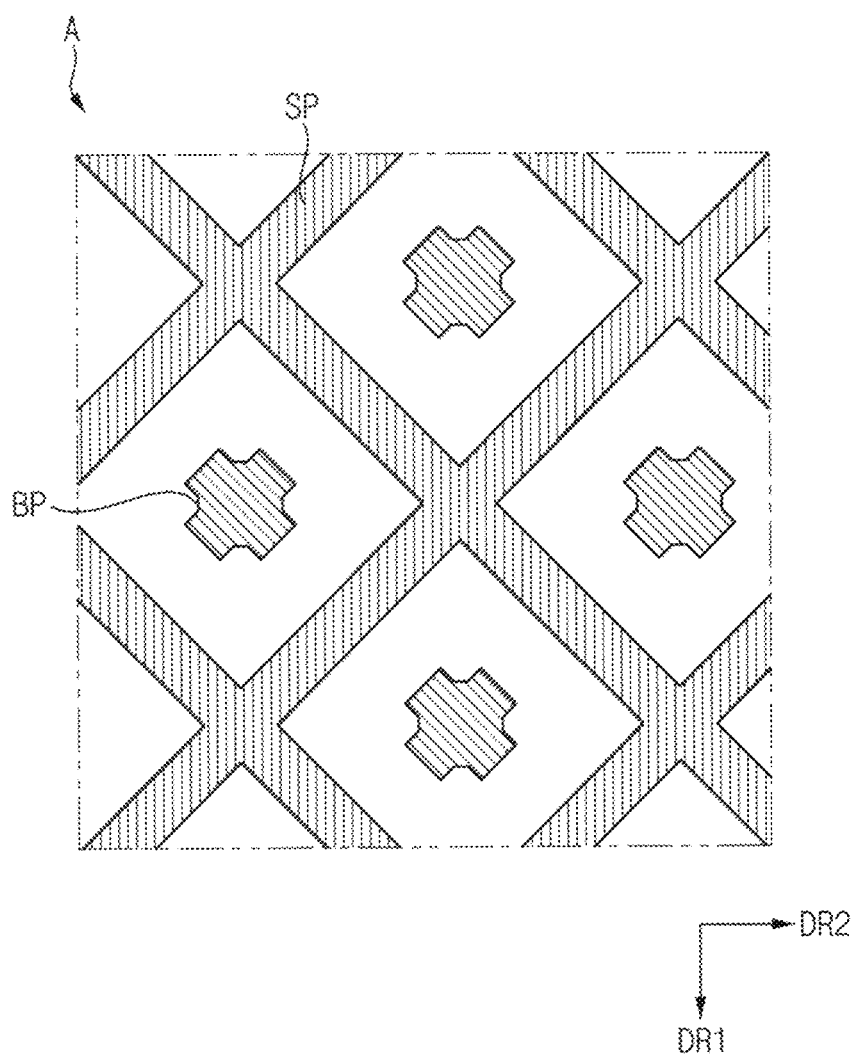
FIG. 4A is a plan view enlarging an area A of FIG. 3.
Figure 4B:
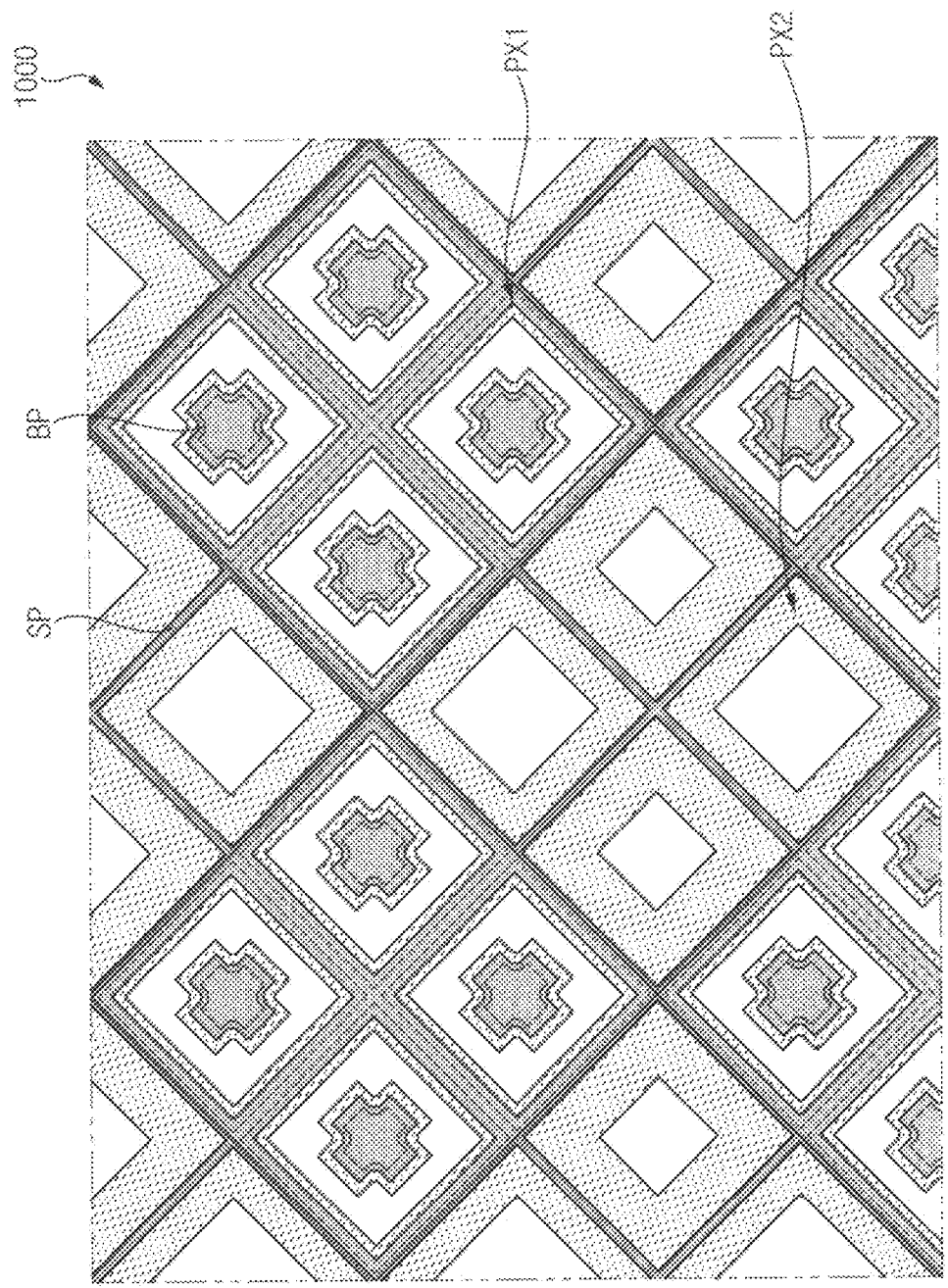
FIG. 4B is a plan view illustrating a display panel and a touch sensing layer included in the display device of FIG. 1.

FIG. 3 is a plan view illustrating a touch sensing layer included in the display device of FIG. 1. FIG. 4A is a plan view enlarging an area A of FIG. 3. FIG. 4B is a plan view illustrating a display panel and a touch sensing layer included in the display device of FIG. 1. As used herein, the plan view is a view in a third direction DR3, and the third direction DR3 is a thickness direction of the display panel DP, and a direction perpendicular to the first direction DR1 and the second direction DR2.

Referring to FIG. 3, the touch sensing layer ISU may include a sensing area SA and a peripheral area PA.

A sensing electrode may be disposed in the sensing area SA. The sensing electrode may include a first sensing electrode SE1 and a second sensing electrode SE2.

The first sensing electrode SE1 may be extend in the second direction DR2, and may be arranged in the first direction DR1. The first sensing electrode SE1 may include a first sensing unit SU1 arranged in the second direction DR2. The second sensing electrode SE2 may be extend in the first direction DR1, and may be arranged in the second direction DR2.

The second electrode SE2 may include a second sensing unit SU2 arranged in the first direction DR1. The first sensing unit SU1 and the second sensing unit SU2 may detect touch of the user.

The peripheral area PA may be disposed adjacent to at least one side of the sensing area SA. A sensing wire electrically connected to the first sensing electrode SE1 or the second sensing electrode SE2 may be disposed in the peripheral area PA.

In an embodiment, the sensing area SA may overlap the display area DA of the display panel DP in a plan view. Accordingly, the display device 1000 may detect touch of the user in an area displaying an image (for example, the display area DA).

Referring to FIG. 4A and FIG. 4B, the second sensing unit SU2 may include a sensing pattern SP and a light blocking pattern BP.

The sensing pattern SP may detect touch of the user. In an embodiment, the sensing pattern SP may be disposed in a mesh form. In this case, the sensing pattern SP may not overlap an emitting area (for example, EA of FIG. 5) of the first pixel PX1, and may not overlap an emitting area (for example, EA' of FIG. 7) of the second pixel PX2 in a plan view.

The light blocking pattern BP may be spaced apart from the sensing pattern SP. The light blocking pattern BP may be electrically insulated from the sensing pattern SP. The light blocking pattern BP may overlap the first pixel PX1, and may not overlap the second pixel PX2 in a plan view. The light blocking pattern BP may block a portion of light emitted from the first pixel PX1, and accordingly, light emitted from the first pixel PX1 may have a relatively narrow viewing angle.

The first sensing unit SU1 may be substantially same as the second sensing unit SU2. In an embodiment, for example, as shown in the FIG. 4A and FIG. 4B, the first sensing unit SU1 may include the sensing pattern SP disposed in a mesh form and the light blocking pattern BP spaced apart from the sensing pattern SP.

Figure 5:
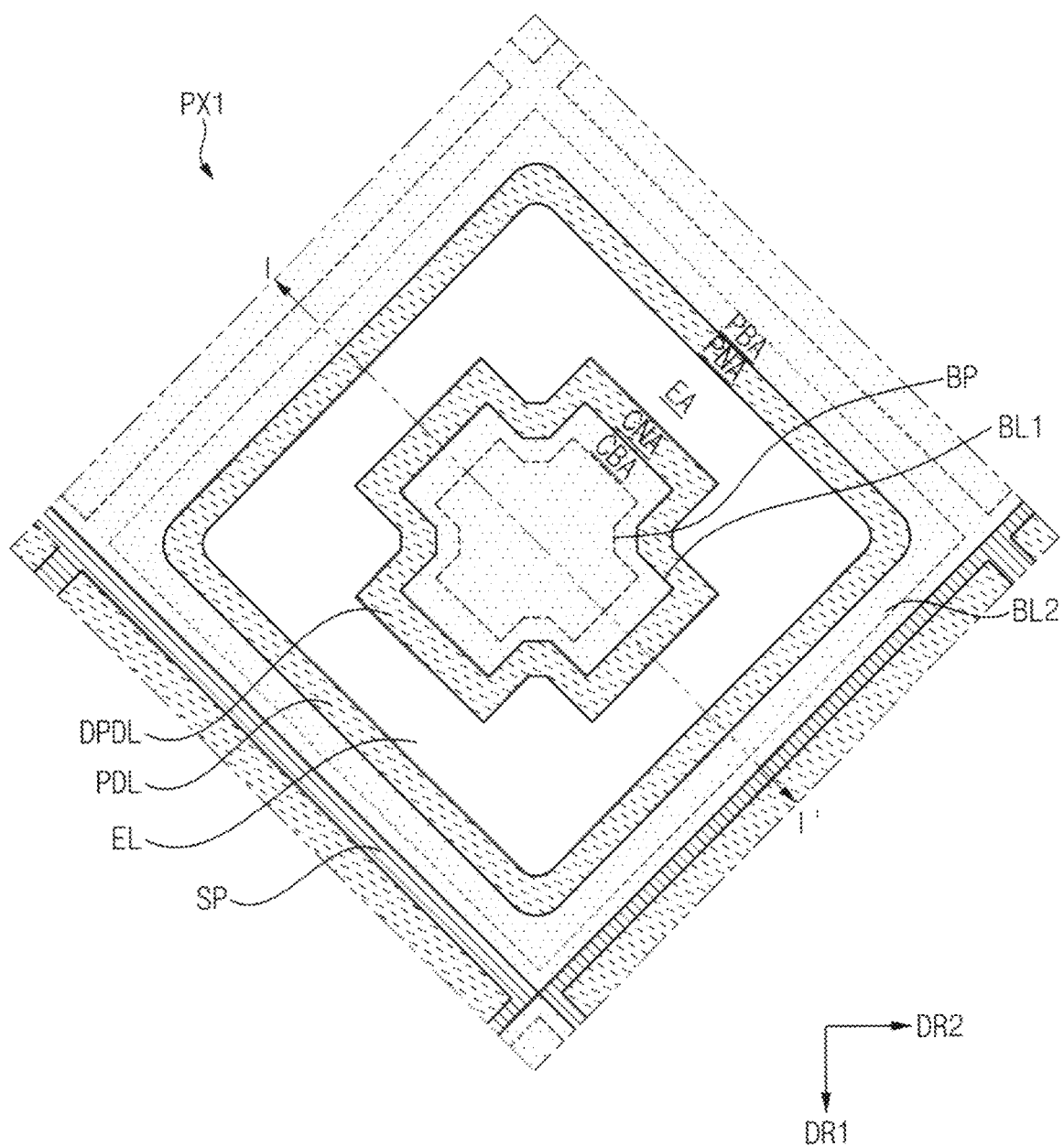
FIG. 5 is a plan view illustrating a first pixel included in the display device of FIG. 1.
Figure 6:
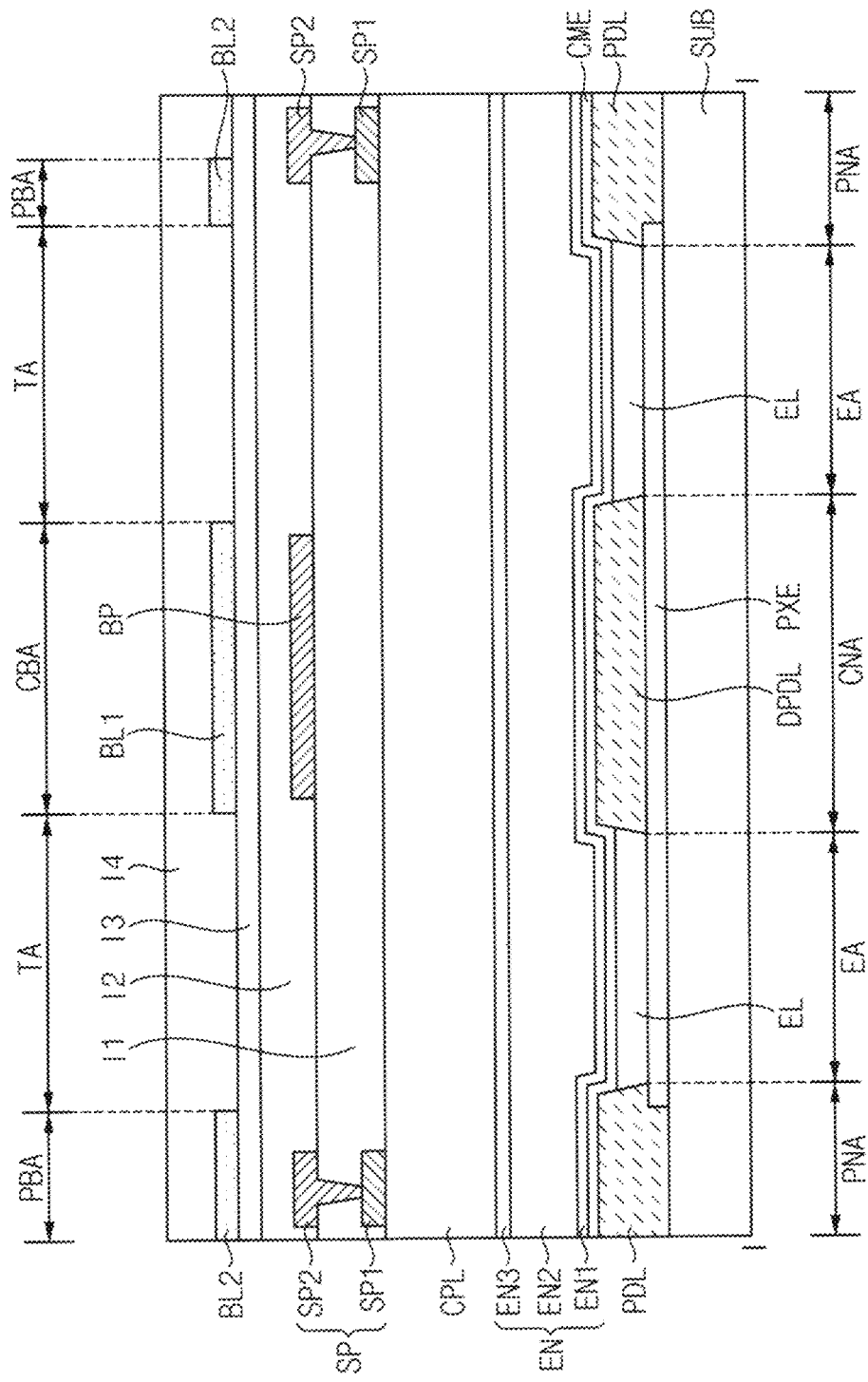
FIG. 6 is a cross-sectional view taken along line I-I' of FIG. 5.

FIG. 5 is a plan view illustrating a first pixel included in the display device of FIG. 1. FIG. 6 is a cross-sectional view taken along line I-I' of FIG. 5.

Referring to FIG. 5 and FIG. 6, the first pixel PX1 may include a substrate SUB, a pixel electrode PXE, a pixel defining layer PDL, a dummy pixel defining layer DPDL, a light emitting element EL, a common electrode CME, an encapsulation layer EN, a capping layer CPL, a touch sensing layer, a third insulating layer I3, a first light blocking layer BL1, a second light blocking layer BL2, and a fourth insulating layer I4. The touch sensing layer (e.g., ISU in FIGS. 1 and 3) may include the sensing pattern SP, a first insulating layer I1, a second insulating layer I2, and a light blocking pattern BP. The sensing pattern SP may include a first sensing pattern SP1 and a second sensing pattern SP2.

The substrate SUB may include glass, plastic, etc. The substrate SUB may include at least one transistor. In an embodiment, the substrate SUB may include a material having flexibility, and thus, the substrate SUB may have a flexibility.

The pixel electrode PXE may be disposed on the substrate SUB. The pixel electrode PXE may include a conductive material. The pixel electrode PXE may be electrically connected to the transistor. In an embodiment, the pixel electrode PXE may be referred to as an anode electrode.

The pixel defining layer PDL may be disposed on the substrate SUB. The pixel defining layer PDL may include an organic material. The pixel defining layer PDL may define a pixel opening exposing at least a portion of the pixel electrode PXE.

The dummy pixel defining layer DPDL may be disposed on the pixel electrode PXE in the pixel opening. The dummy pixel defining layer DPDL may include the same material as the pixel defining layer PDL. In an embodiment, for example, the dummy pixel defining layer DPDL may include an organic material. The dummy pixel defining layer DPDL may be spaced apart from the pixel defining layer PDL.

The light emitting element EL may be disposed between the pixel defining layer PDL and the dummy pixel defining layer DPDL in the pixel opening. In an embodiment, the light emitting element EL may include an organic light emitting element.

The pixel defining layer PDL, the dummy pixel defining layer DPDL, and the light emitting element EL may define a peripheral non-emitting area PNA, an emitting area EA, and a central non-emitting area CNA, respectively. The central non-emitting area CNA may be defined as an area in which the dummy pixel defining layer DPDL is disposed, the emitting area EA may be defined as an area in which the light emitting element EL is disposed, and the peripheral non-emitting area PNA may be defined as an area in which the pixel defining layer PDL is disposed. As shown in the FIG. 5, the light emitting area EA may surround the central non-emitting area CNA, the peripheral non-emitting area PNA may surround the central non-emitting area CNA and the light emitting area EA. The peripheral non-emitting area PNA may be spaced apart from the central non-emitting area CNA.

In FIG. 5, an embodiment in which the central non-emitting area CNA has a '+' shape on a plan view is illustrated, but the central non-emitting area CNA may have various shapes. In an embodiment, for example, the central non-emitting area CNA may have a circle shape, an ellipse shape, a square shape, or a polygon shape in a plan view.

The common electrode CME may cover the pixel defining layer PDL, the dummy pixel defining layer DPDL, and the light emitting element EL. The common electrode CME may include a transparent conductive material. In an embodiment, the common electrode CME may be referred to as a cathode electrode.

The encapsulation layer EN may cover the common electrode CME. The encapsulation layer EN may include a first inorganic encapsulation layer EN1 covering the common electrode CME, an organic encapsulation layer EN2 covering the first encapsulation layer EN1, and the second encapsulation layer EN3 covering the organic encapsulation layer EN2. The encapsulation layer EN may protect the common electrode CME, the light emitting element EL, and the pixel electrode PXE from moisture and gas.

The capping layer CPL may be disposed on the encapsulation layer EN. In an embodiment, the capping layer CPL may include an inorganic insulating material. In another embodiment, the capping layer CPL may include a plurality of insulating layers. In an embodiment, for example, the capping layer CPL may include a plurality of inorganic insulating layers. For another example, the capping layer CPL may include a plurality of inorganic insulating layers and a plurality of organic insulating layers.

The touch sensing layer may be disposed on the capping layer CPL. Specifically, the first sensing pattern SP1 may be disposed on the capping layer CPL, the first insulating layer I1 may be disposed on the capping layer CPL and may cover the first sensing pattern SP1, the second sensing pattern SP2 and the light blocking pattern BP may be disposed on the first insulation layer I1, and the second insulation layer I2 may be disposed on the first insulation layer I1 and may cover the second sensing pattern SP2 and the light blocking pattern BP. In this case, the second sensing pattern SP2 may be electrically connected to the first sensing pattern SP2 through the through hole penetrating the first insulating layer I1. In addition, the light blocking pattern BP may be insulated from each of the first sensing pattern SP1 and the second sensing pattern SP2 by the first insulating layer I1 and the second insulating layer I2.

The sensing pattern SP may be a pattern included in the first sensing electrode SE1 described with FIG. 3. Or, the sensing pattern SP may be a pattern included in the second sensing electrode SE2. In an embodiment, the sensing pattern SP may be disposed in a mesh form. In an embodiment, for example, each of the first sensing pattern SP1 and the second sensing pattern SP2 may surround the light emitting element EL.

In an embodiment, the first sensing pattern SP1 may be disposed to overlap a portion of the pixel defining layer PDL. In other words, the first sensing pattern SP1 may be disposed in the peripheral non-emitting area PNA. The second sensing pattern SP2 may be disposed in the peripheral non-emitting area PNA to overlap the first sensing pattern SP1 in a plan view.

Each of the first sensing pattern SP1 and the second sensing pattern SP2 may include a conductive material having relatively high conductivity. In an embodiment, each of the first sensing pattern SP1 and the second sensing pattern SP2 may have a tri-layer structure of Ti/Al/Ti (titanium/aluminum/titanium).

The light blocking pattern BP may overlap a portion of the dummy pixel defining layer DPDL. Or, the light blocking pattern BP may completely overlap the dummy pixel defining layer DPDL in a plan view. In other words, the light blocking pattern BP may be disposed in the central non-emitting area CNA. In this case, the second sensing pattern SP2 may surround the light blocking pattern BP, and may be spaced apart from the light blocking pattern BP.

In an embodiment, an area of the light blocking pattern BP in a plan view may be equal to or more than about 80% and less than about 100% of an area of the dummy pixel defining layer DPDL in a plan view. When the area of the light blocking pattern BP in a plan view is smaller than about 80% of the area of the dummy pixel defining layer DPDL, the light blocking pattern BP may not effectively block light having a relatively wide viewing angle. When the area of the light blocking pattern BP in a plan view is larger than about 100% of the area of the dummy pixel defining layer DPDL, light emitted perpendicular to an upper surface of the light emitting element EL may be blocked by the light blocking pattern BP, so light efficiency of the first pixel PX1 may be reduced.

In an embodiment, the second sensing pattern SP2 may include a material having a relatively large conductivity and blocking light, and the light blocking pattern BP may include the same material as the second sensing pattern SP2.

The third insulating layer I3 may be disposed on the second insulating layer I2. The third insulating layer I3 may include an insulating material. In an embodiment, the third insulating layer I3 may be a color filter layer. In this case, the third insulating layer I3 may transmit light having a specific wavelength and block light having a wavelength different from the specific wavelength.

The first light blocking layer BL1 and the second light blocking layer BL2 may be disposed on the third insulating layer I3. The first light blocking layer BL1 and the second light blocking layer BL2 may include a light blocking material. In an embodiment, for example, the first light blocking layer BL1 and the second light blocking layer BL2 may include an organic light blocking material.

The first light blocking layer BL1 may overlap a portion of the dummy pixel defining layer DPDL. Or, the first light blocking layer BL1 may completely overlap the dummy pixel defining layer DPDL in a plan view. The second light blocking layer BL2 may overlap a portion of the pixel defining layer PDL. In an embodiment, the second light blocking layer BL2 may define a transmissive opening completely overlapping the pixel opening in a plan view. In another embodiment, the second light blocking layer BL2 may define a transmissive opening having an area larger than the area of the pixel opening. The second light blocking layer BL2 may surround the first light blocking layer BL1, and may be spaced apart from the first light blocking layer BL1.

The first light blocking layer BL1 and the second light blocking layer BL2 may not overlap the emitting area EA in a plan view. Accordingly, light emitted perpendicular to the upper surface of the light emitting element EL may not be blocked by the first light blocking layer BL1 and the second light blocking layer BL2.

The first light blocking layer BL1 and the second light blocking layer BL2 may define a central light blocking area CBA, a peripheral light blocking area PBA, and a transmissive area TA. The central light blocking area CBA may be defined as an area in which the first light blocking layer BL1 is disposed, the peripheral light blocking area PBA may be defined as an area in which the second light blocking layer BL2 is disposed, and the transmissive area TA may be defined as an area in which the first light blocking layer BL1 and the second light blocking layer BL2 is not disposed. The peripheral light blocking area PBA may surround the central light blocking area CBA, and may be spaced apart from the central light blocking area CBA. The transmissive area TA may be disposed between the central light blocking area CBA and the peripheral light blocking area PBA. In an embodiment, the transmissive area TA may completely overlap the emitting area EA in a plan view.

In an embodiment, the light blocking pattern BP may overlap a portion of the first light blocking layer BL1 in a plan view. In this case, an area of the first light blocking layer BL1 in a plan view may be larger than an area of the light blocking pattern BP in a plan view, and may be smaller than or substantially same as an area of the dummy pixel defining layer DPDL in a plan view.

In an embodiment, a portion of the sensing pattern SP may overlap a portion of the second light blocking layer BL2 in a plan view.

The fourth insulating layer I4 may be disposed on the third insulating layer I3. The fourth insulating layer I4 may cover the first light blocking layer BL1 and the second light blocking layer BL2. The fourth insulating layer I4 may include an insulating material.

Figure 7:
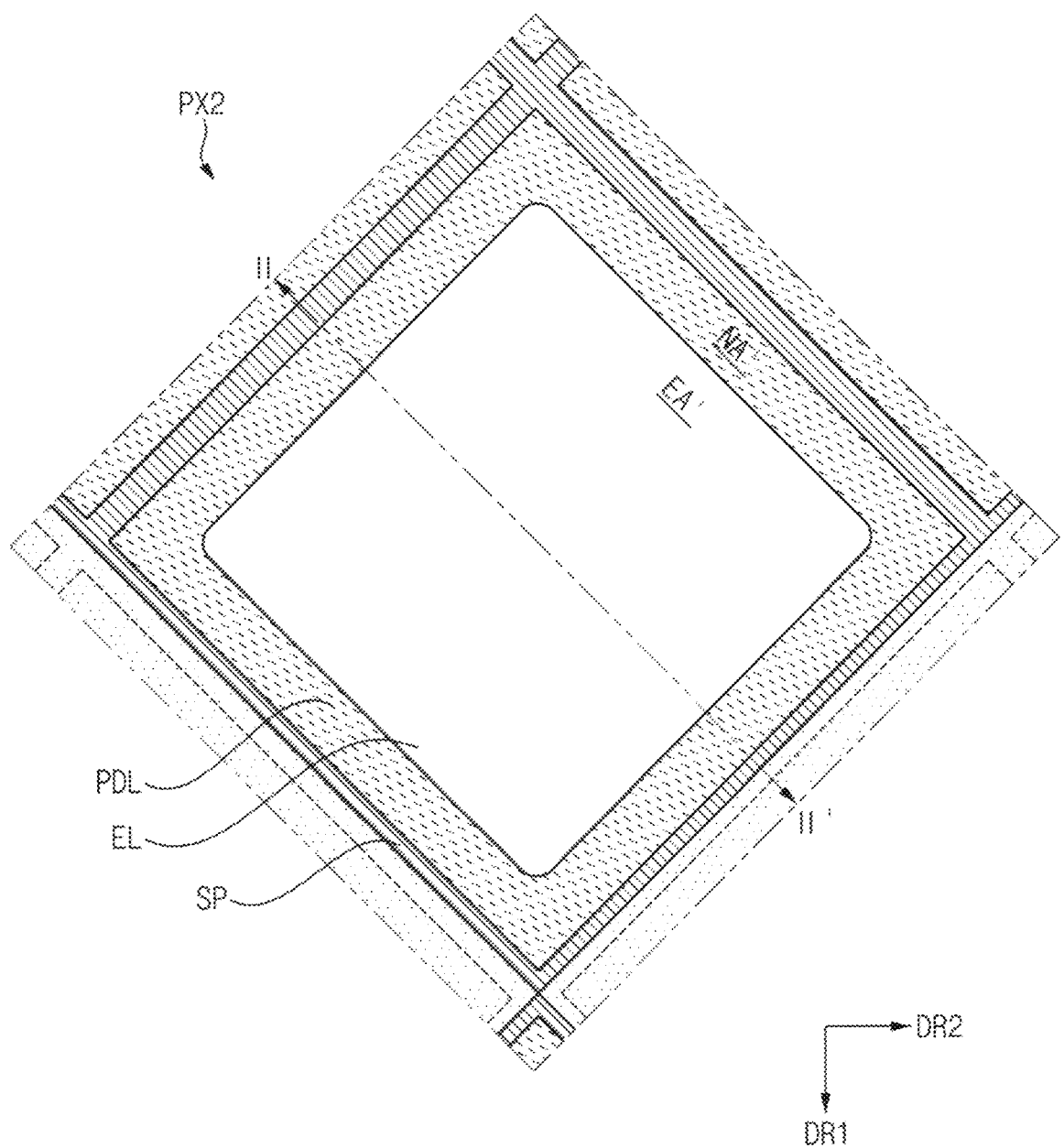
FIG. 7 is a plan view illustrating a second pixel included in the display device of FIG. 1.
Figure 8:
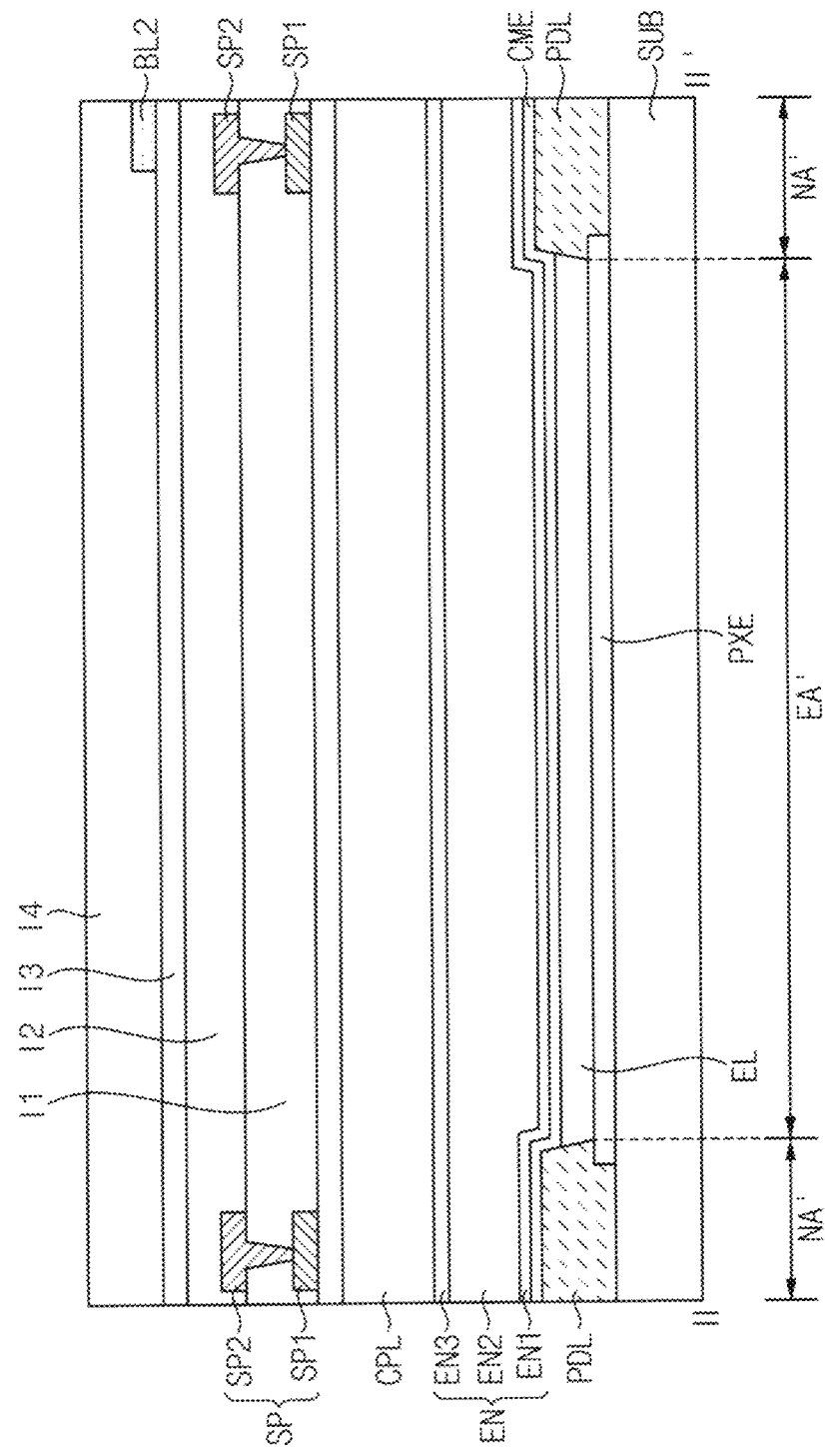
FIG. 8 is a cross-sectional view taken along line II-II' of FIG. 7.

FIG. 7 is a plan view illustrating a second pixel included in the display device of FIG. 1. FIG. 8 is a cross-sectional view taken along line II-II' of FIG. 7. Description of a configuration substantially same as the configuration described with reference to FIG. 5 and FIG. 6 may be omitted.

Referring to FIG. 7 and FIG. 8, the second pixel PX2 may include a substrate SUB, a pixel electrode PXE, a pixel defining layer PDL, a light emitting element EL, a common electrode CME, an encapsulation layer EN, a capping layer CPL, a touch sensing layer, a third insulating layer I3, a fourth insulating layer I4. The touch sensing layer may include the sensing pattern SP, a first insulating layer I1, and a second insulating layer I2, and a sensing pattern SP may include a first sensing pattern SP1 and a second sensing pattern SP2.

The pixel electrode PXE may be disposed on the substrate SUB. The pixel defining layer PDL may be disposed on the substrate SUB, and may define a pixel opening exposing at least a portion of the pixel electrode PXE. The light emitting element EL may be disposed in the pixel opening.

The light emitting element EL and the pixel defining layer PDL included in the second pixel PX2 may define a emitting area EA' and a non-emitting area NA'. The emitting area EA' may be defined as an area in which the light emitting element EL is disposed, and the non-emitting area NA' may be defined as an area in which the pixel defining layer PDL is disposed. The non-emitting area NA' may surround the emitting area EA'.

The common electrode CME may cover the pixel electrode PXE, the pixel defining layer PDL, and the light emitting element EL, and the encapsulation layer EN may cover the common electrode CME. The capping layer CPL may be disposed on the encapsulation layer EN.

The touch sensing layer (e.g., ISU in FIGS. 1 and 3) may be disposed on the capping layer CPL. The touch sensing layer may be substantially same as the touch sensing layer described with reference to FIG. 5 and FIG. 6 except for including the light blocking pattern BP. In other words, the touch sensing layer of the second pixel PX2 may not include the light blocking pattern BP.

The third insulating layer I3 may be disposed on the second insulating layer I2, and the fourth insulating layer I4 may be disposed on the third insulating layer I3. In an embodiment, the third insulating layer I3 may be a color filter layer.

Referring again to FIG. 5, FIG. 6, FIG. 7, and FIG. 8, unlike the second pixel PX2, the first pixel PX1 may include the dummy pixel defining layer DPDL, the light blocking pattern BP, the first light blocking layer BL1, and the second light blocking layer BL2. Accordingly, light emitted from the first pixel PX1 may have relatively narrow viewing angle, and light emitted from the second pixel PX2 may have relatively wide viewing angle.

Figure 9:
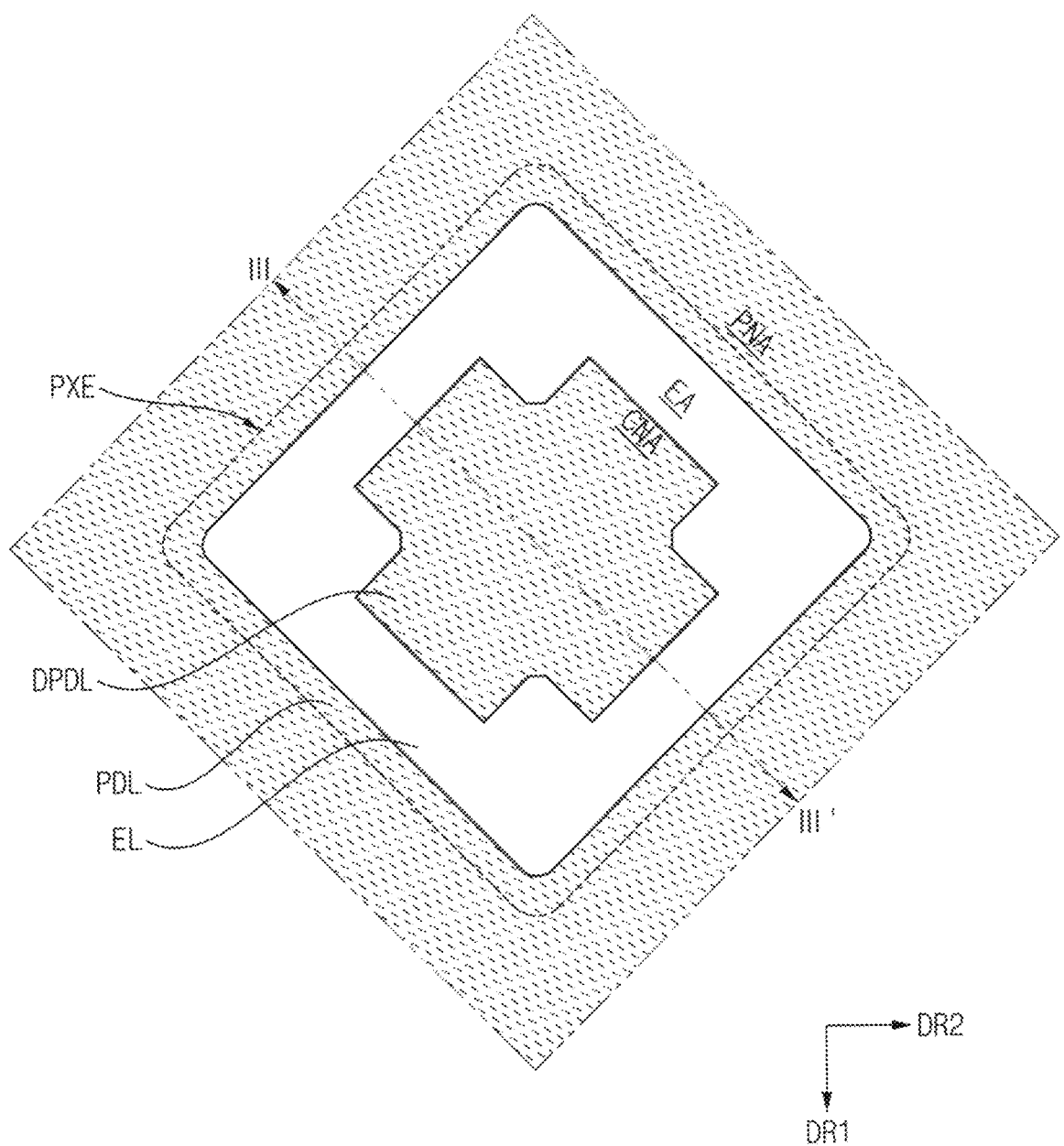
FIG. 9, FIG. 10, FIG. 11, FIG. 12, FIG. 13, and FIG. 14 are diagrams illustrating a method of manufacturing the display device of FIG. 1.
Figure 10:
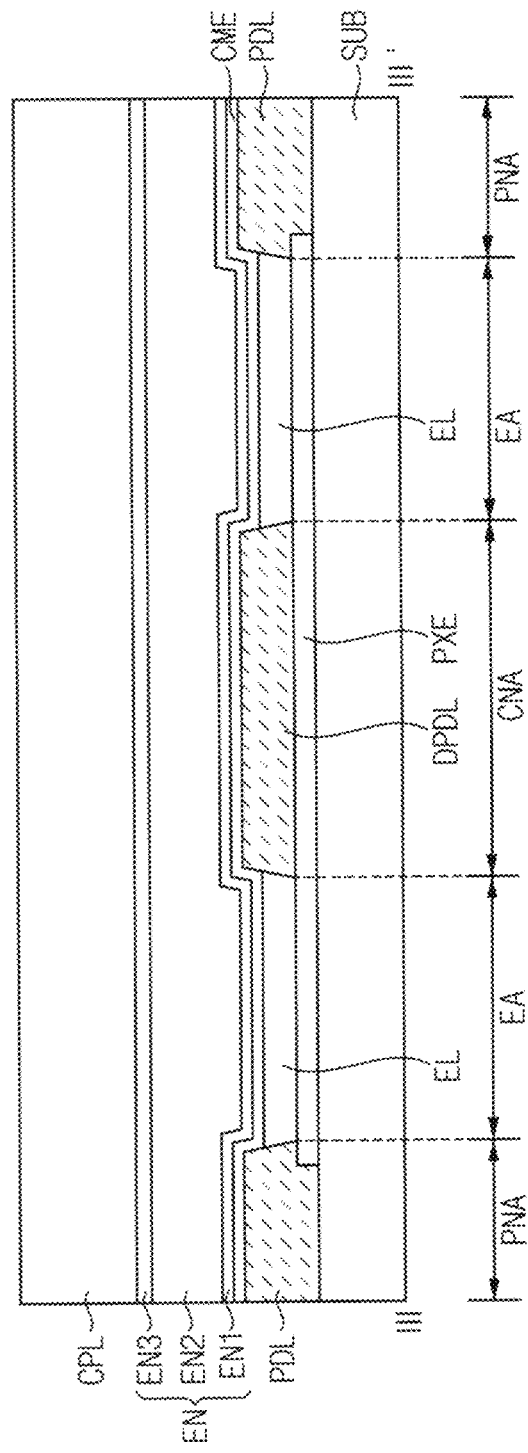
Figure 11:
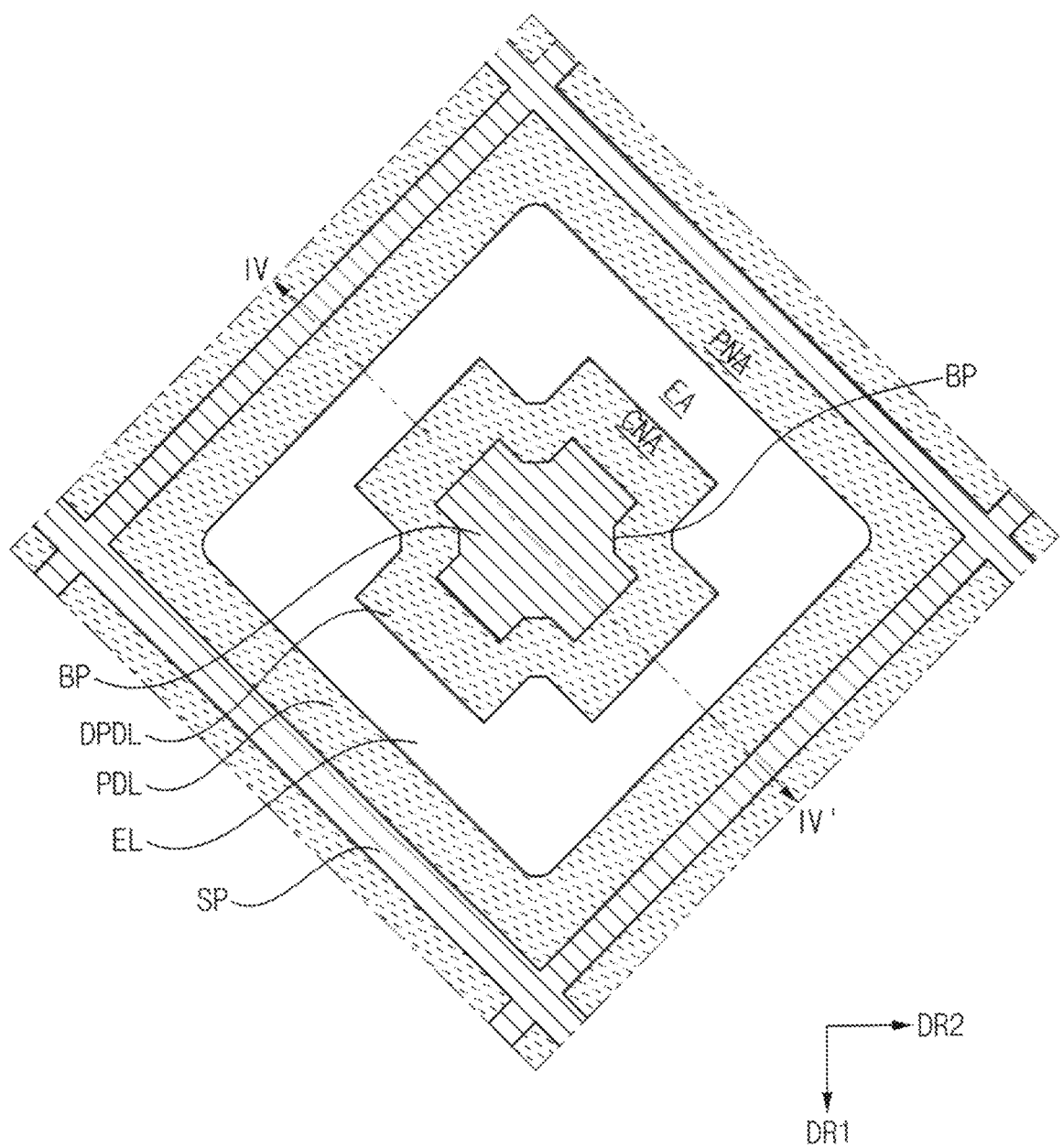
Figure 12:
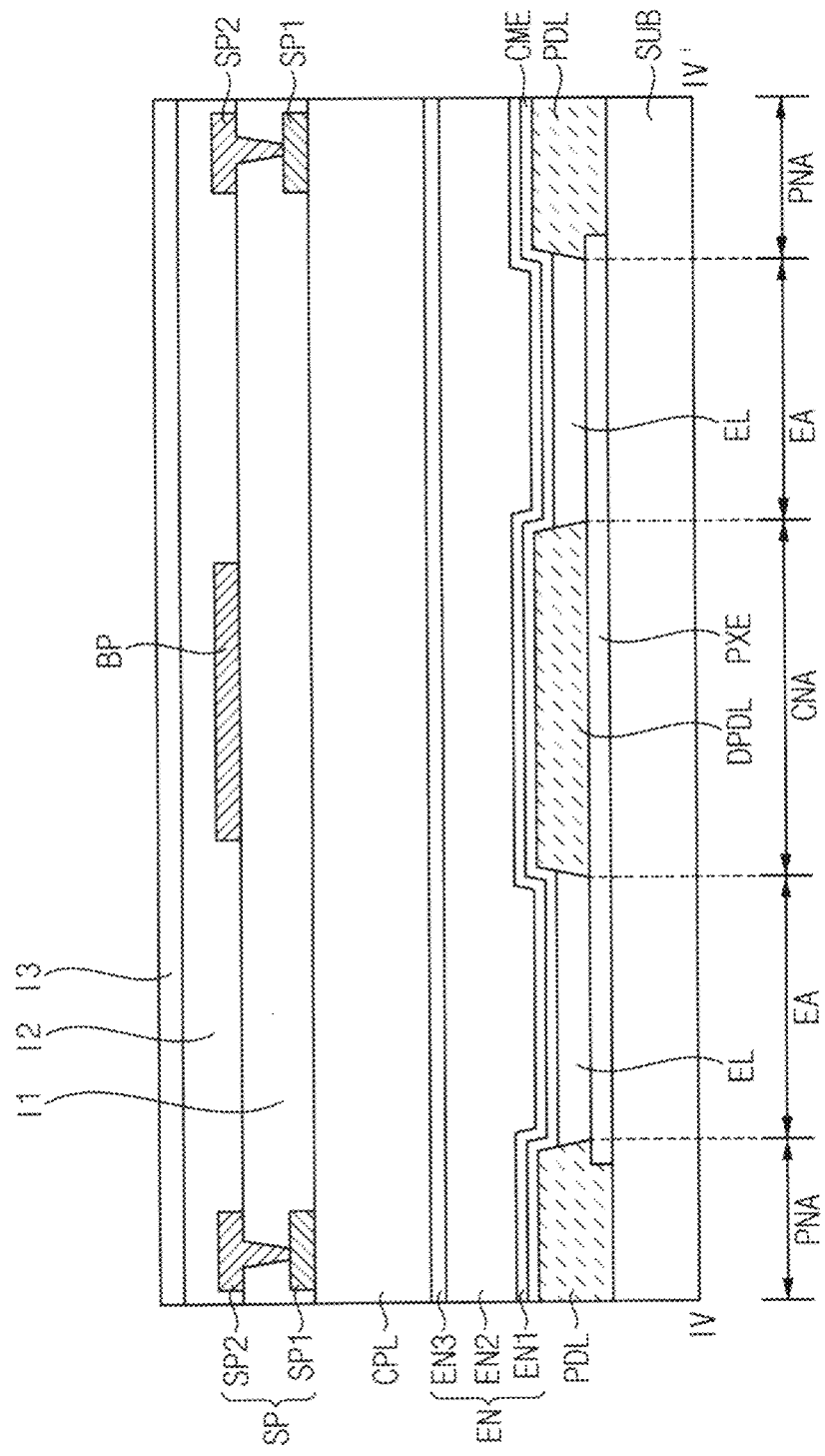
Figure 13:
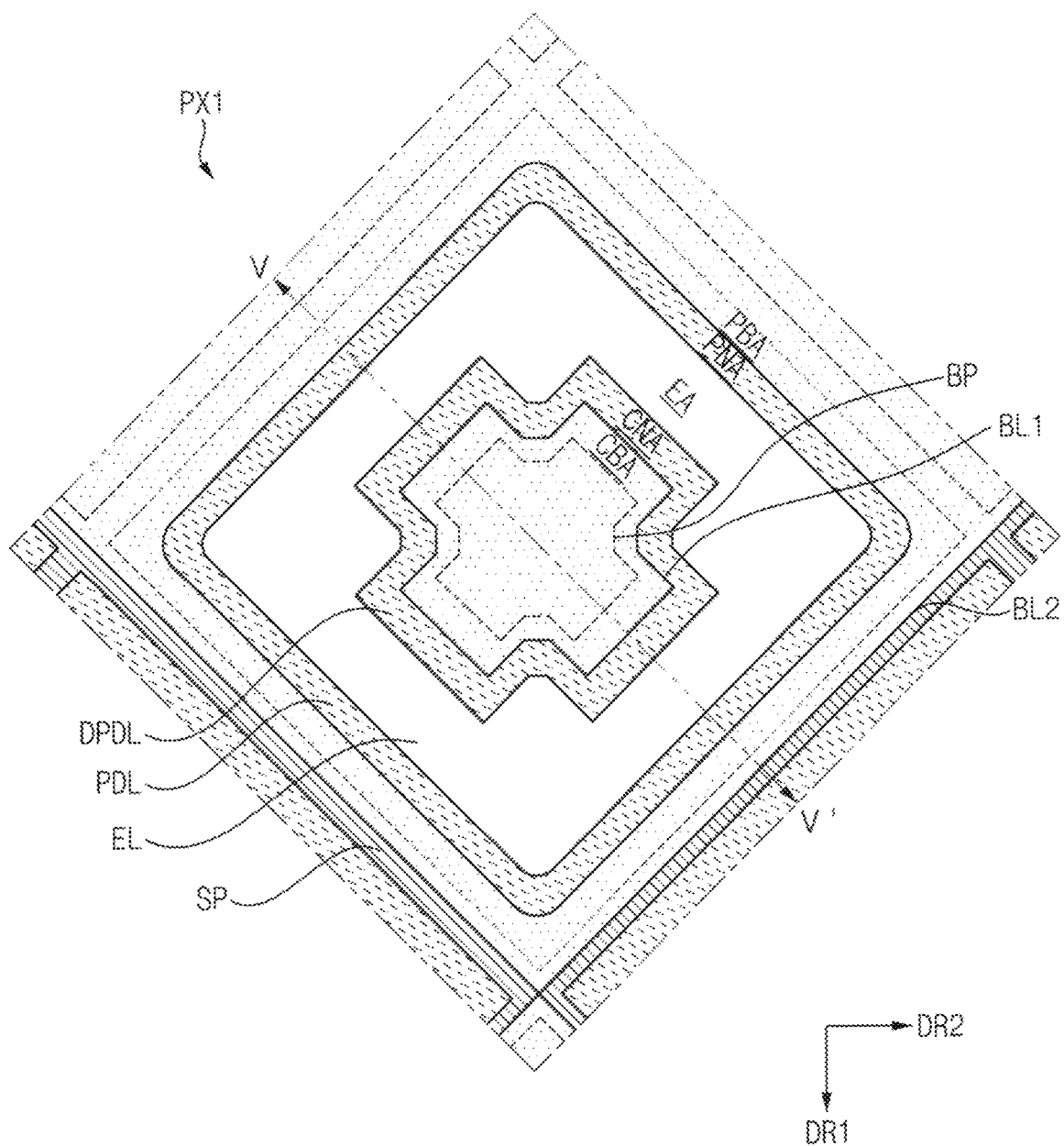
Figure 14:
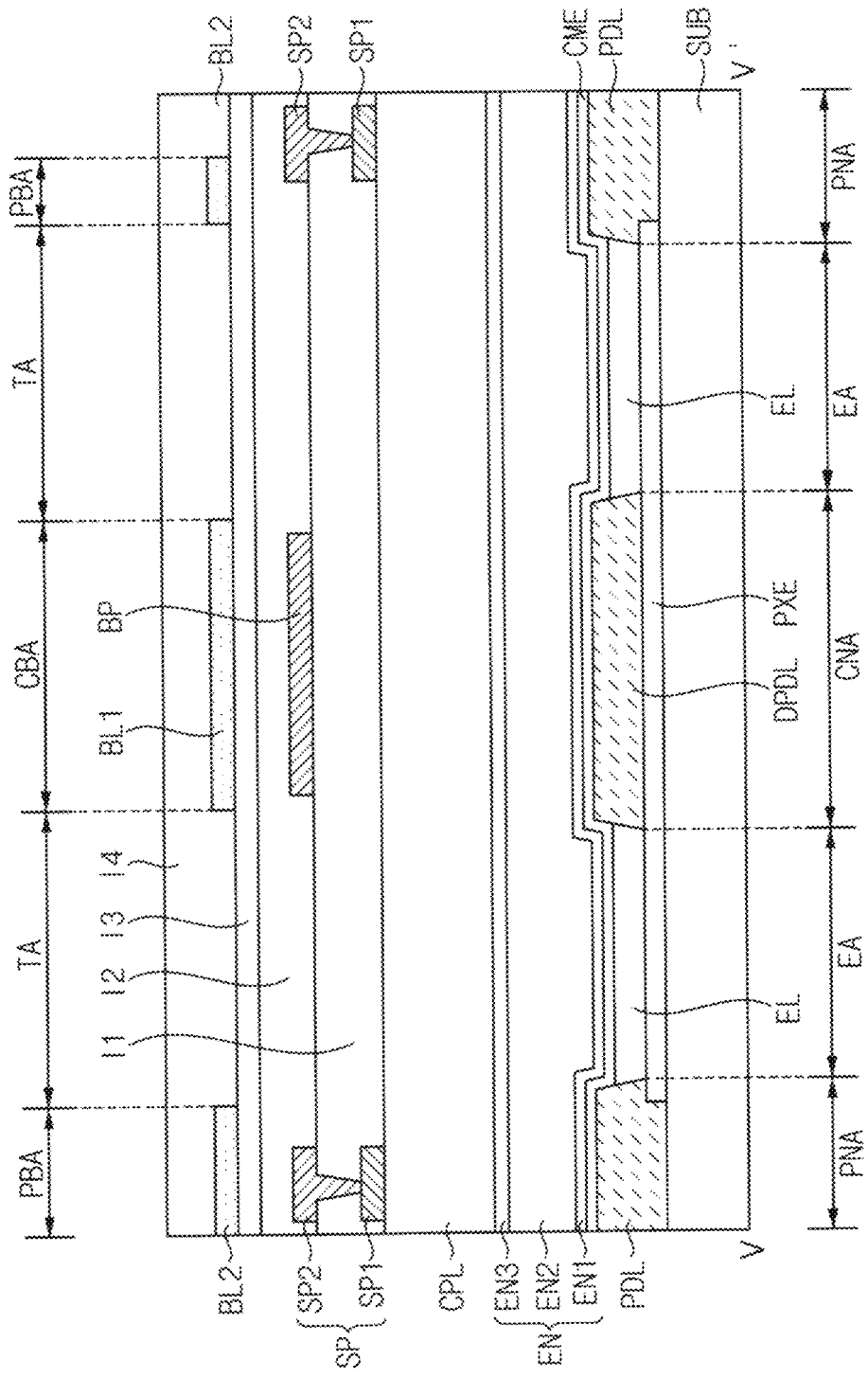

FIG. 9, FIG. 10, FIG. 11, FIG. 12, FIG. 13, and FIG. 14 are diagrams illustrating a method of manufacturing the display device of FIG. 1. Here, FIG. 10 is a cross-sectional view taken along line III-III' of FIG. 9, FIG. 12 is a cross-sectional view taken along line IV-IV' of FIG. 11, FIG. 14 is a cross-sectional view taken along line V-V' of FIG. 13, Description of a configuration substantially same as the configuration described with reference to FIG. 1, FIG. 2, FIG. 3, FIG. 4, FIG. 5, and FIG. 6 may be omitted.

Referring to FIG. 9 and FIG. 10, a pixel electrode PXE, a pixel defining layer PDL, a dummy pixel defining layer DPDL, and a light emitting element EL may be formed on a substrate SUB. In addition, after forming a common electrode CME covering the pixel defining layer PDL, the dummy pixel defining layer DPDL, and the light emitting element EL, an encapsulation layer EN covering the common electrode CME and a capping layer CPL disposed on the encapsulation layer EN may be formed.

In an embodiment, the pixel defining layer PDL and the dummy pixel defining layer DPDL may be integrally formed. In an embodiment, for example, the pixel defining layer PDL and the dummy pixel defining layer DPDL may be formed by coating an organic material on the substrate SUB to cover the pixel electrode PXE and then patterning the organic material.

As described above with reference to FIG. 5 and FIG. 6, the pixel defining layer PDL, the dummy pixel defining layer DPDL, and the light emitting element EL may define a peripheral non-emitting area PNA, a central non-emitting area CNA, and an emitting area EA.

Referring to FIG. 11 and FIG. 12, after forming a touch sensing layer including a sensing pattern SP, a first insulating layer I1, a second insulating layer I2, and a light blocking pattern BP on the capping layer CPL, a third insulating layer I3 may be formed on the touch sensing layer.

In an embodiment, the second sensing pattern SP2 and the light blocking pattern BP may be integrally formed. In an embodiment, for example, a method of forming the touch sensing layer may include applying a first conductive material on the capping layer CPL, forming the first sensing pattern SP1 by patterning the first conductive material, forming the first insulating layer I1 covering the first sensing pattern SP1, applying a second conductive material on the first insulating layer I1, and forming the second sensing pattern SP2 and the light blocking pattern BP by patterning the second conductive material. In this case, the method of forming the touch sensing layer may further include electrically connecting the first sensing pattern SP1 and the second sensing pattern SP2 by forming a through hole penetrating the first insulating layer I1.

Referring to FIG. 13 and FIG. 14, after forming a first light blocking layer BL1 and a second light blocking layer BL2 on the third insulating layer I3, a fourth insulating layer I4 covering the first light blocking layer BL1 and the second light blocking layer BL2 may be formed on the third insulating layer I3.

In an embodiment, the first light blocking layer BL1 and the second light blocking layer BL2 may be integrally formed. In an embodiment, for example, after applying a light blocking material on the third insulating layer, the light blocking material may be patterned to form the first light blocking layer BL1 and the second light blocking layer BL2.

Figure 15:
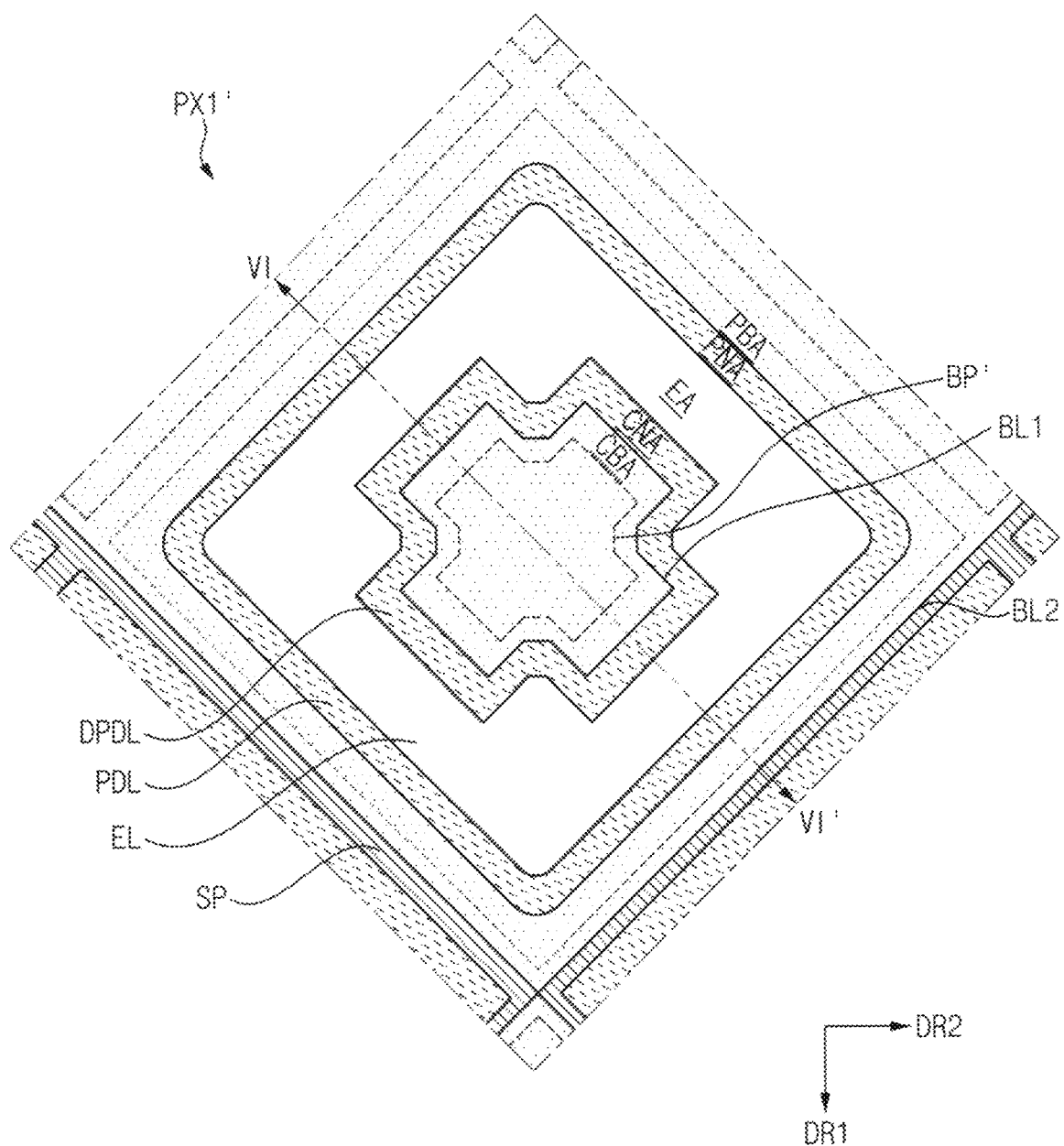
FIG. 15 and FIG. 16 are diagrams illustrating a pixel included in a display device according to another embodiment.
Figure 16:
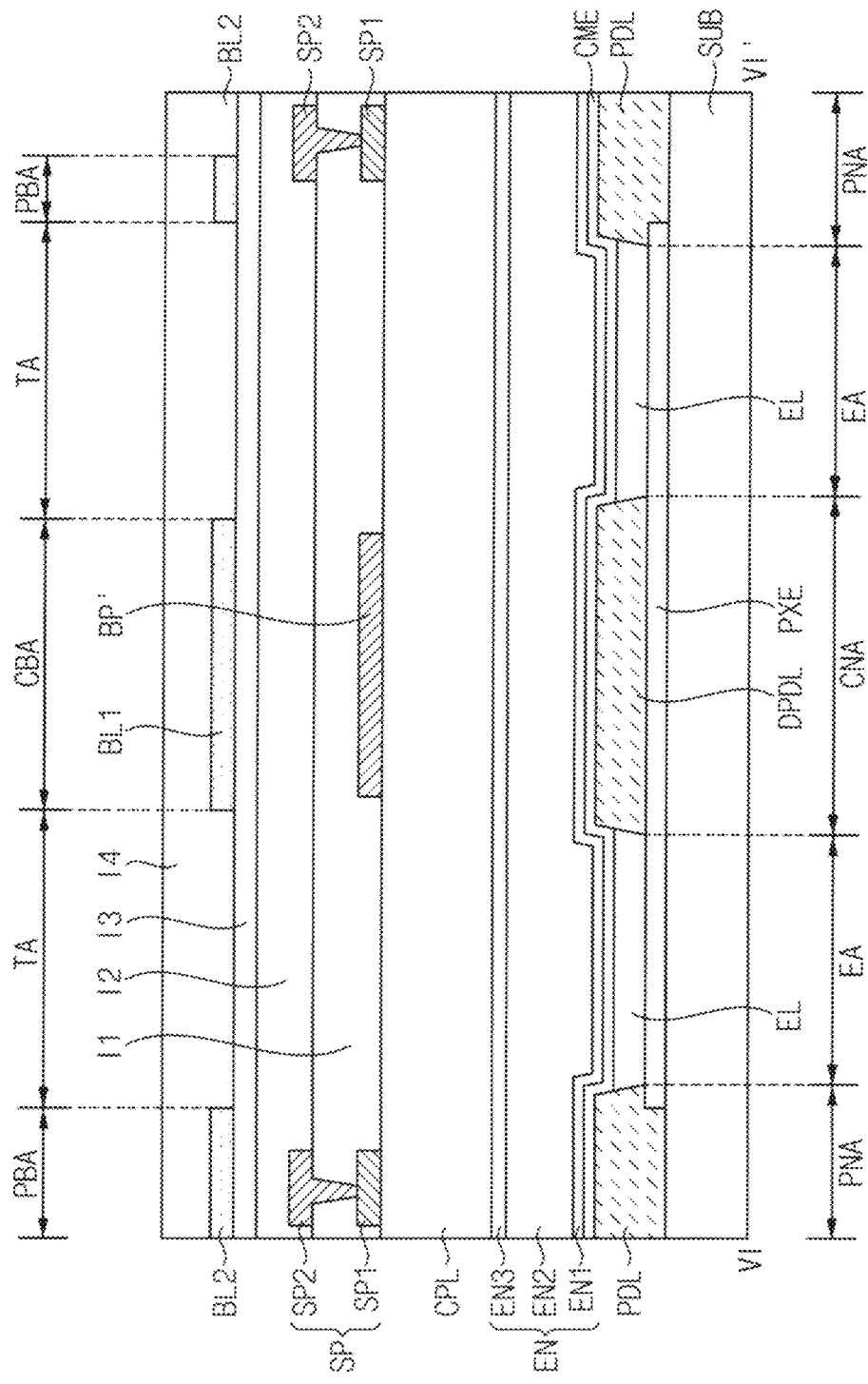

FIG. 15 and FIG. 16 are diagrams illustrating a pixel included in a display device according to another embodiment. FIG. 16 is a cross-sectional view taken along line VI-VI' of FIG. 15. Description of a configuration substantially same as the configuration described with reference to FIG. 1, FIG. 2, FIG. 3, FIG. 4, FIG. 5, and FIG. 6 may be omitted.

Referring to FIG. 15 and FIG. 16, a display device according to another embodiment may include a first pixel PX1' emitting light having a relatively narrow viewing angle.

The first pixel PX1' may include a substrate SUB, a pixel electrode PXE, a pixel defining layer PDL, a dummy pixel defining layer DPDL, a light emitting element EL, a common electrode CME, an encapsulation layer EN, a capping layer CPL, a touch sensing layer, a third insulating layer I3, a first light blocking layer BL1, a second light blocking layer BL2, and a fourth insulating layer I4. The touch sensing layer (e.g., ISU in FIGS. 1 and 3) may include a sensing pattern SP, a first insulating layer I1, a second insulating layer I2, and a lower light blocking pattern BP', and the sensing pattern SP may include a first sensing pattern SP1 and a second sensing pattern SP2.

The lower light blocking pattern BF may be disposed in the same layer as the first sensing pattern SP1. In an embodiment, for example, the lower light blocking pattern BF may be disposed on the capping layer CPL.

The lower light blocking pattern BP' may overlap a portion of the dummy pixel defining layer DPDL. Or, the lower light blocking pattern BP' may completely overlap the dummy pixel defining layer DPDL in a plan view. In other words, the lower light blocking pattern BF may be disposed in a central non-emitting area CNA. In this case, the first sensing pattern SP1 may surround the lower light blocking pattern BP, and may be spaced apart from the lower light blocking pattern BP'. In an embodiment, an area of the lower light blocking pattern BF in a plan view may be equal to or more than about 80% and less than about 100% of an area of the dummy pixel defining layer DPDL in a plan view.

The lower light blocking pattern BP' may be insulated from the sensing pattern SP. In an embodiment, for example, the lower light blocking pattern BP' may be insulated from the first sensing pattern SP1 and the second sensing pattern SP2 by the encapsulation layer EN, the first insulating layer I1, and the second insulating layer I2.

In an embodiment, the first sensing pattern SP1 may include a material having a relatively high conductivity and blocking light, and the lower light blocking pattern BP' may include the same material as the first sensing pattern SP1.

Figure 17:
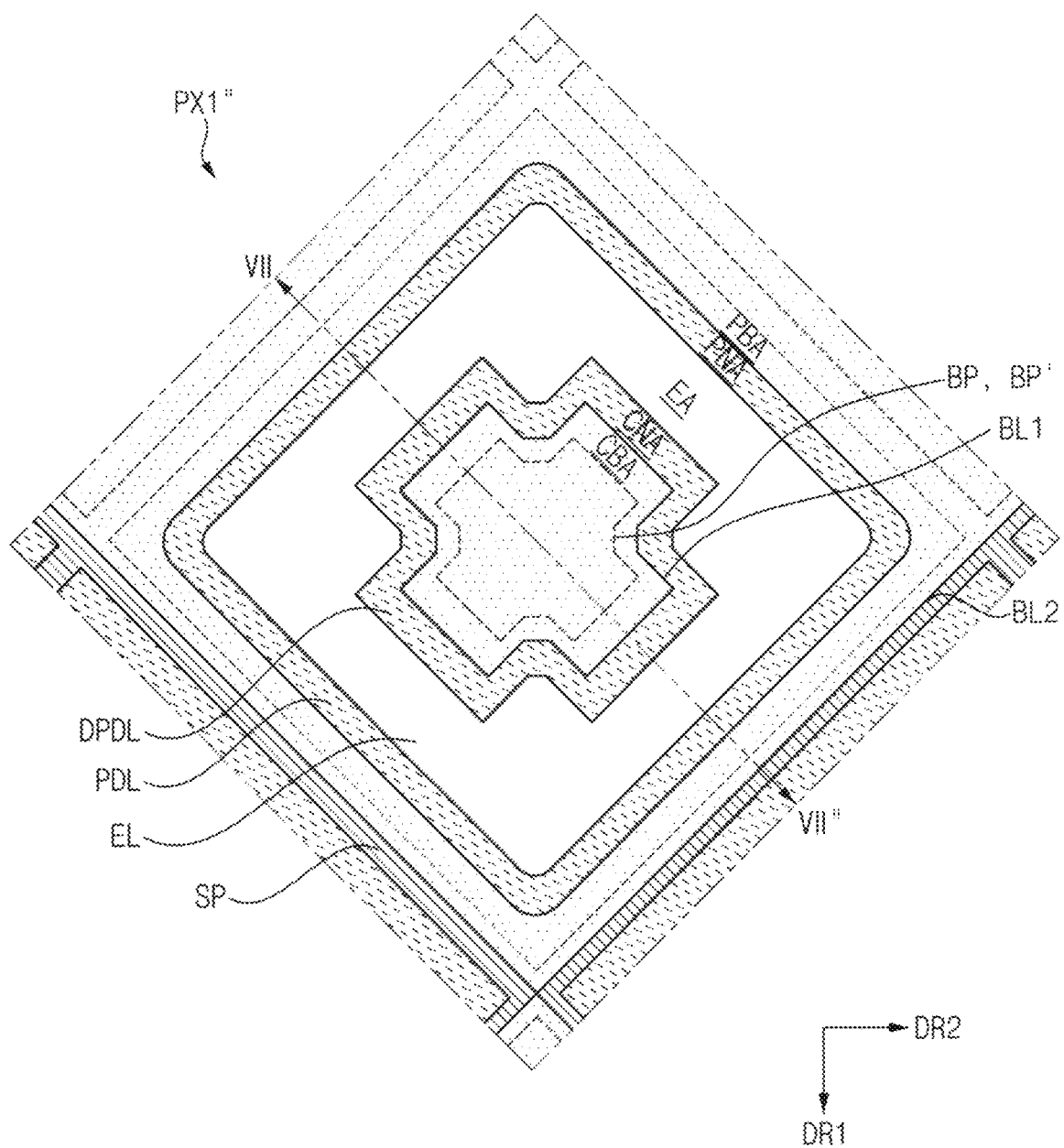
FIG. 17 and FIG. 18 are diagrams illustrating a pixel included in the display device according to still another embodiment.
Figure 18:
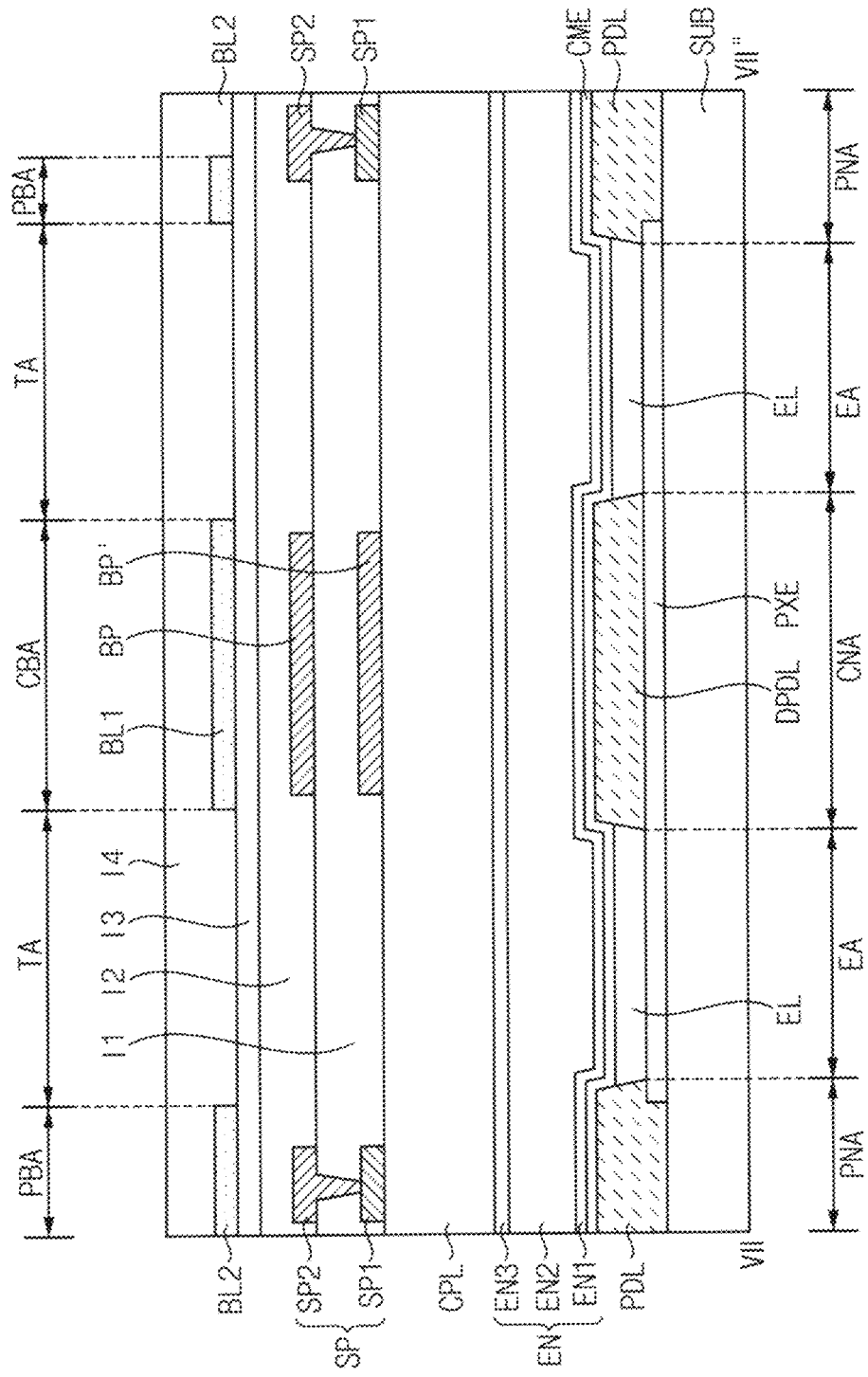

FIG. 17 and FIG. 18 are diagrams illustrating a pixel included in the display device according to still another embodiment. FIG. 18 is a cross-sectional view taken along line VII-VII' of FIG. 17. Description of a configuration substantially same as the configuration described with reference to FIG. 1, FIG. 2, FIG. 3, FIG. 4, FIG. 5, FIG. 6, FIG. 15, and FIG. 16 may be omitted.

Referring to FIG. 17 and FIG. 18, a display device according to still another embodiment may include a first pixel PX1" emitting light having a relatively narrow viewing angle.

The first pixel PX1" may include a substrate SUB, a pixel electrode PXE, a pixel defining layer PDL, a dummy pixel defining layer DPDL, a light emitting element EL, a common electrode CME, an encapsulation layer EN, a capping layer CPL, a touch sensing layer, a third insulating layer I3, a first light blocking layer BL1, a second light blocking layer BL2, and a fourth insulating layer I4. The touch sensing layer (e.g., ISU in FIGS. 1 and 3) may include a sensing pattern SP, a first insulating layer I1, a second insulating layer I2, a light blocking pattern BP, and a lower light blocking pattern BP', and the sensing pattern SP may include a first sensing pattern SP1 and a second sensing pattern SP2.

The light blocking pattern BP may be disposed in the same layer as the second sensing pattern SP2, and the lower light blocking pattern BF may be disposed in the same layer as the first sensing pattern SP1. In this case, the light blocking pattern BP may be named as an upper light blocking pattern. The lower light blocking pattern BF may be insulated from the light blocking pattern BP. In an embodiment, the lower light blocking pattern BF may completely overlap the light blocking pattern BP in a plan view.

The present invention can be applied to various display devices that may include a display device. In an embodiment, for example, the present invention can be applied to high-resolution smartphones, mobile phones, smart pads, smart watches, tablet PCs, in-vehicle navigation systems, televisions, computer monitors, notebook computers, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
    a first pixel and a second pixel on a substrate, the first pixel has a relatively narrow viewing angle, and the second pixel has a relatively wide viewing angle, and
    wherein the first pixel includes:
    a substrate;
    a pixel electrode disposed on the substrate;
    a pixel defining layer disposed on the substrate and defining a pixel opening exposing a portion of the pixel electrode;
    a dummy pixel defining layer disposed on the pixel electrode in the pixel opening, and spaced apart from the pixel defining layer in a plan view;

a light emitting element disposed between the pixel defining layer and the dummy pixel defining layer in the pixel opening;

a common electrode covering the pixel defining layer, the dummy pixel defining layer, and the light emitting element;

an encapsulation layer covering the common electrode; and a touch sensing layer comprising a light blocking pattern, wherein the light blocking pattern is disposed on the encapsulation layer and overlaps at least a portion of the dummy pixel defining layer in the plan view.

2. The display device of claim 1, wherein the touch sensing layer further comprises:

a first sensing pattern disposed on the encapsulation layer and overlapping at least a portion of the pixel defining layer in the plan view;

a first insulating layer covering the first sensing pattern; and a second sensing pattern disposed on the first insulating layer, overlapping at least a portion of the pixel defining layer in the plan view, and electrically connected to the first sensing pattern.

3. The display device of claim 2, wherein the light blocking pattern is insulated from each of the first sensing pattern and the second sensing pattern.

4. The display device of claim 2, wherein the light blocking pattern comprises an upper light blocking pattern disposed in a same layer as the second sensing pattern.

5. The display device of claim 4, wherein the light blocking pattern comprises a lower light blocking pattern disposed in a same layer as the first sensing pattern.

6. The display device of claim 5, wherein the upper light blocking pattern overlaps the lower light blocking pattern in the plan view.

7. The display device of claim 2, wherein each of the first sensing pattern and the second sensing pattern is disposed in a mesh form surrounding the light emitting element in the plan view, and overlaps at least a portion of the pixel defining layer in the plan view.

8. The display device of claim 1, wherein an area of the light blocking pattern in the plan view is more than or equal to about 80 percent (%) and less than about 100% of an area of the dummy pixel defining layer in the plan view.

9. The display device of claim 1, further comprising:

a first light blocking layer disposed on the touch sensing layer, and overlapping at least a portion of the dummy pixel defining layer in the plan view; and a second light blocking layer disposed on the touch sensing layer, and overlapping at least a portion of the pixel defining layer in the plan view.

10. The display device of claim 9, wherein the second light blocking layer surrounds the first light blocking layer, and is spaced apart from the first light blocking layer.

11. The display device of claim 9, wherein the light blocking pattern overlaps at least a portion of the first light blocking layer in the plan view.

12. The display device of claim 9, further comprising:

a color filter layer disposed between the touch sensing layer and the first light blocking layer.

13. The display device of claim 9, wherein an area of the first light blocking layer in the plan view is equal to or larger than the area of the light blocking pattern in the plan view, and is equal to or smaller than the area of the dummy pixel defining layer in the plan view.

14. A method of manufacturing a display device comprising:

forming a first pixel on a substrate, the first pixel has a relatively narrow viewing angle; and forming a second pixel on the substrate, the second pixel has a relatively wide viewing angle, and wherein in the forming of the first pixel includes:

forming a pixel electrode on the substrate;

forming a pixel defining layer and a dummy pixel defining layer on the substrate, wherein the pixel defining layer defines a pixel opening exposing at least a portion of the pixel electrode, and the dummy pixel defining layer is disposed on the pixel electrode in the pixel opening and is spaced apart from the pixel defining layer in a plan view;

forming a light emitting element disposed between the pixel defining layer and the dummy pixel defining layer in the pixel opening;

forming a common electrode covering the pixel defining layer, the dummy pixel defining layer, and the light emitting element;

forming an encapsulation layer covering the common electrode; and forming a touch sensing layer on the encapsulation layer, wherein the touch sensing layer comprises a light blocking pattern overlapping at least a portion of the dummy pixel defining layer in the plan view.

15. The method of claim 14, wherein forming the touch sensing layer comprises:

applying a first conductive material on the encapsulation layer;

forming a first sensing pattern overlapping at least a portion of the pixel defining layer in the plan view by patterning the first conductive material;

forming a first insulating layer covering the first sensing pattern;

applying a second conductive material on the first insulating layer; and forming a second sensing pattern and the light blocking pattern by patterning the second conductive material, wherein the second sensing pattern overlaps at least a portion of the pixel defining layer in the plan view.

16. The method of claim 15, wherein the light blocking pattern is insulated from each of the first sensing pattern and the second sensing pattern.

17. The method of claim 14, wherein an area of the light blocking pattern in the plan view is equal to or more than about 80% and less than about 100% of an area of the dummy pixel defining layer in the plan view.

18. The method of claim 14, further comprising:

applying a light blocking material on the touch sensing layer; and forming a first light blocking layer and a second light blocking layer by patterning the light blocking material, wherein the first light blocking layer overlaps at least a portion of the dummy pixel defining layer in the plan view, and the second light blocking layer overlaps at least a portion of the pixel defining layer in the plan view.

19. The method of claim 18, wherein the second light blocking layer surrounds the first light blocking layer, and is spaced apart from the first light blocking layer.

20. The method of claim 18, wherein an area of the first light blocking layer in the plan view is equal to or larger than an area of the light blocking pattern in the plan view, and is equal to or smaller than an area of the dummy pixel defining layer in the plan view.

* * * * *